Figure 1:
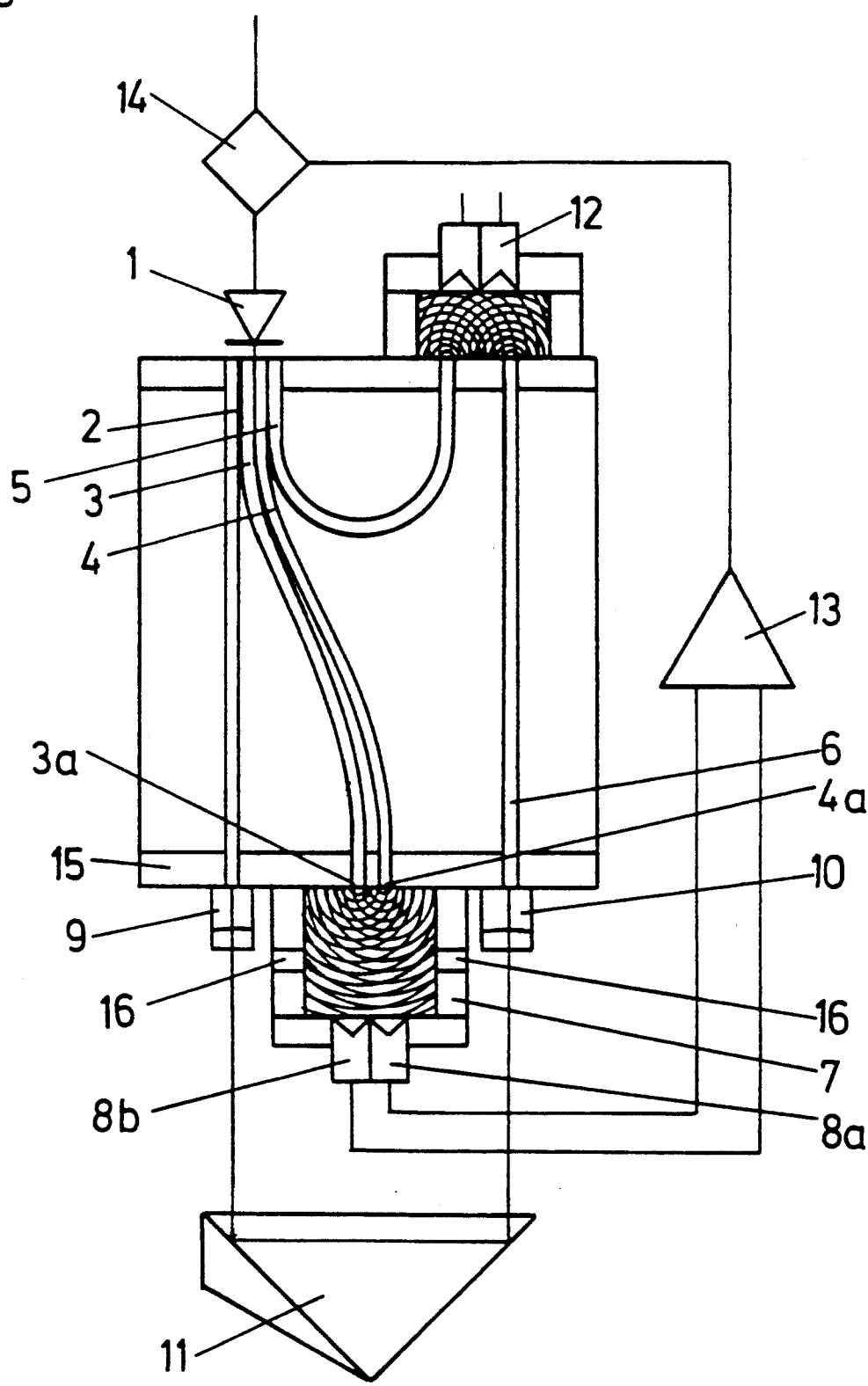

United States Patent [19]
Leuchs et al.

[11] Patent Number: 5,172,185
[45] Date of Patent: Dec. 15, 1992

[54] DEVICE FOR DETERMINING OR STABILIZING THE WAVELENGTH OF LASER LIGHT IN A GASEOUS AMBIENT MEDIUM

[75] Inventors: Gerhard Leuchs, Azmoos; Martin Kerner, Kirchdorf, both of Switzerland

[73] Assignee: Warner Tabarelli, Schaan, Liechtenstein

[21] Appl. No.: 634,150
[22] PCT Filed: Apr. 6, 1990
[86] PCT No.: PCT/EP90/00538
  § 371 Date: Jan. 30, 1991
  § 102(e) Date: Jan. 30, 1991
[87] PCT Pub. No.: WO90/12279
  PCT Pub. Date: Oct. 18, 1990

[30] Foreign Application Priority Data
  Apr. 8, 1989 [DE] Fed. Rep. of Germany ....... 3911473

[51] Int. Cl.⁵ .................................................. G01B 9/02
[52] U.S. Cl. .................................. 356/358; 356/345; 356/361
[58] Field of Search ............... 356/345, 358, 361, 128; 250/227.19, 227.27

[56] References Cited

U.S. PATENT DOCUMENTS

| | | | |
|---|---|---|---|
| 4,668,093 | 5/1987 | Cahill | 356/345 |
| 4,722,603 | 2/1988 | Graebner et al. | 356/345 |
| 4,747,688 | 5/1988 | Geary | 356/345 |

*Primary Examiner*—Samuel A. Turner
*Attorney, Agent, or Firm*—Lorusso & Loud

[57] ABSTRACT

Device for stabilizing the wavelength in air of a laser diode for an Interferometer which measures length in waveguide technology. To stablize the wavelength in air, an interference phenomenon, according to Young, is produced and detected in an air chamber of constant and stable length with two point-shaped light waves of a coherent beam. The point-shaped light waves are formed by the ends of waveguides. The photo-detectors and the control device control the frequency of the laser diode so that the interference phenomenon, and therefore the wavelength in air, remain stable inside the reference chamber. The arrangement is simple and compact.

27 Claims, 4 Drawing Sheets

DEVICE FOR DETERMINING OR STABILIZING THE WAVELENGTH OF LASER LIGHT IN A GASEOUS AMBIENT MEDIUM

The invention concerns a device for finding and stabilizing the wavelengths of coherent light from a laser light source found in a preferably gaseous ambient medium, with at least one photo-detector unit to detect interference generated by light from the laser light source in the ambient medium.

In interferometric length-measuring technology, the wavelength in the ambient medium (most often air) is the scale for the measurement. The wavelength (air wavelength) changes in free atmosphere in correlation with the refraction index of the air, which changes with the temperature, pressure and moisture, for example. Interferometers which use gas lasers (He-Ne) are frequency stabilized, since the discharge line itself is used as a frequency reference. Here, the influence of the refraction index of the air is often measured parametrically (temperature, pressure, moisture) and calculated by the Edlen formula, and the interferometric measurement value is then corrected by computer. This method requires a normal air mixture, which no longer corresponds to current circumstances in industrial and leads to errors.

It is therefore more advantageous to detect the air wavelength or the interference connected with it directly (and not the frequency and refraction index separately). Wavelength-stabilized He-Ne gas lasers are now known (Swiss Patent 461 114 and Swiss Patent 503 285) that have, however, a small adjustment range and are very expensive. (Feinwerktechnik und Meßtechnik 87, [1979], 8, pp. 368-372).

Besides laser-diode interferometers that do not detect environmental conditions whose sources of radiation are stabilized as to temperature and current, but whose frequency changes because of aging phenomena and hysterasis effects, (EP Application 135 000), there are also known laser-diode interferometers in waveguide technology in which interference generated in the ambient medium (air) is used to detect the refraction index of the air (computer correction) (De-OS 37 15 627). Apart from problems in evaluating the interference signals, a mirror, which has to be adjusted precisely, is provided there for coupling the light from the inflated reference interferometer into a light waveguide leading to the photo detectors.

It is the object of the invention to provide a device as mentioned at the outset for determining or detecting an air wavelength which has a simple, compact optical construction and still permits precise determination or stabilization of the air wavelength.

According to the invention this is accomplished by the fact that light coming from the laser light source emanates from two spaced locations, which basically constitute point laser light sources, into the ambient medium and that the light waves emitted by the basically point light sources interfere in the ambient medium forming spatial interference detected by one or more photo-detector units.

The light waves emitted by the spaced, basically point (i.e., expansion preferably smaller than 30 μm, better still, smaller than 10 μm) light sources overlap each other and interfere (somewhat like Young interference).

This interference phenomenon is first static, and the interference basically depend only on the geometry of the overlap of the two (or more) waves. But if the refraction index of the ambient medium changes, the interference also changes if the frequency of the laser light source is constant. The best way to detect the interference is to have two photo detectors arranged so that the detected radiation intensities change in the opposite direction of the interference moves. Here it is important that the distance between the detectors and the sources remains constant and stable. This can be achieved by a simple spacer ring, which is made of a material that is substantially uninfluenced by the parameters (especially the temperature) that influence the refraction index of the ambient medium. For this, quartz glass of glass ceramic with a thermal coefficient of expansion of $\alpha = 10^{-8}$ to $10^{-8} K^{-1}$ is used accordingly. The precision of the stabilization can be increased even more if this spacer ring and the holder of the "light sources" are made thermostatic, either along with a laser diode as light source, which requires a temperature control to set its working point or separately, if the wavelength reference put near the measuring path will be farther away during measurement.

The signals emitted by the photo-detector units can be detected and used to detect the air wavelength, or, if the frequency is known, of the refraction index. With the preferred use in an interferometer for length measurement (here, knowing the air wavelength is of decisive importance), these results can then be processed in a computer along with the real measurement interferometer data, so as to obtain the path of displacement or the like in metric units.

One preferred version of the invention provides that the signals emitted by the photo-detector units be used in order to keep the air wavelength (the interferometric scale of an interferometer) constant. The device therefore contains an electronic control device connected to the photo-detector unit(s) that changes the frequency of the laser light source with variations in the refraction index of the ambient medium so that the spatial interference pattern and thus the wavelength in the ambient medium remain constant.

With such control, the frequency and the refraction index do not have to be found separately. Moreover, the decisive quantity, namely the air wavelength, can be kept constant directly. Such stabilization of the air wavelength is primarily favorable with laser diodes as light sources, since they generally require an external reference for stabilization anyway, and their frequency can be adjusted via the injection current and/or the temperature relatively easily.

The (air) wavelength is stabilized, for example, by trapping interference between two photo detectors (or one differential photo diode), whose intensities are compared by a subsequent comparator. This comparator controls the injection current of the laser diode and thus its frequency, so that the spatial interference phenomenon remains locally stable relative to the photo detectors. There is therefore a constant (air) wavelength with a changing frequency depending on the refraction index of the ambient medium. Such control can, however, also be performed by controlling the temperature of the laser diode, which would exclude regular thermostatic control if their temperature difference is greater than that of the ambient temperature.

The spaced, basically point light sources according to the invention from which the interference-creating radiation is emitted into the surrounding air, can, according to an especially preferred feature of the invention, be formed by the spaced ends of the light waveguide, from which light from the laser light source is emitted into the ambient medium. There is no problem guiding light in light waveguides to practically any point, and the exit ends defining the light sources can be easily fixed and held spatially stable.

Provision may be made, advantageously, for the light waveguides to be made of flexible light-conducting fibers, preferably single-mode glass fibers which are spatially fixed by a holder or the like at least at the ends facing the ambient medium. But it is just as possible and advantageous for the light waveguides to be waveguides (paths) integrated in a carrier (substrate), which end at spaced points at the edge of the carrier, adjacent to the ambient medium. In order to introduce a path difference between the light waves from the individual ends of the optical fibers making it easier to detect interference, it is favorable if the ends of the optical fibers are basically parallel and end at spaced locations, as seen in the longitudinal direction of the fiber. With integrated waveguide paths, provision can also be made, for the same purpose, for the waveguides (paths) to reach the edge of the carrier at an angle differing from 90°, wherein the ends of the waveguide lie in a plane with the lateral face of the carrier.

To achieve this precision, the relative arrangement of point light sources and photo-detector units itself and keeping this relative arrangement constant are of decisive importance. This can be achieved by a relatively simple spacer, which has the photo-detector units on one side and is connected to a holder of the fiberglass ends or the carrier substrate with integrated waveguide paths on the other side, for example. A spacer ring surrounding the space in which the interference occurs appears to be particularly stable. The combination of holder and spacer as wavelength reference is designed with appropriate openings so that the ambient medium can flow in and out in of the space.

Other advantages and details of the invention will be explained in greater detail in the following description of the figures.

Figure 2:
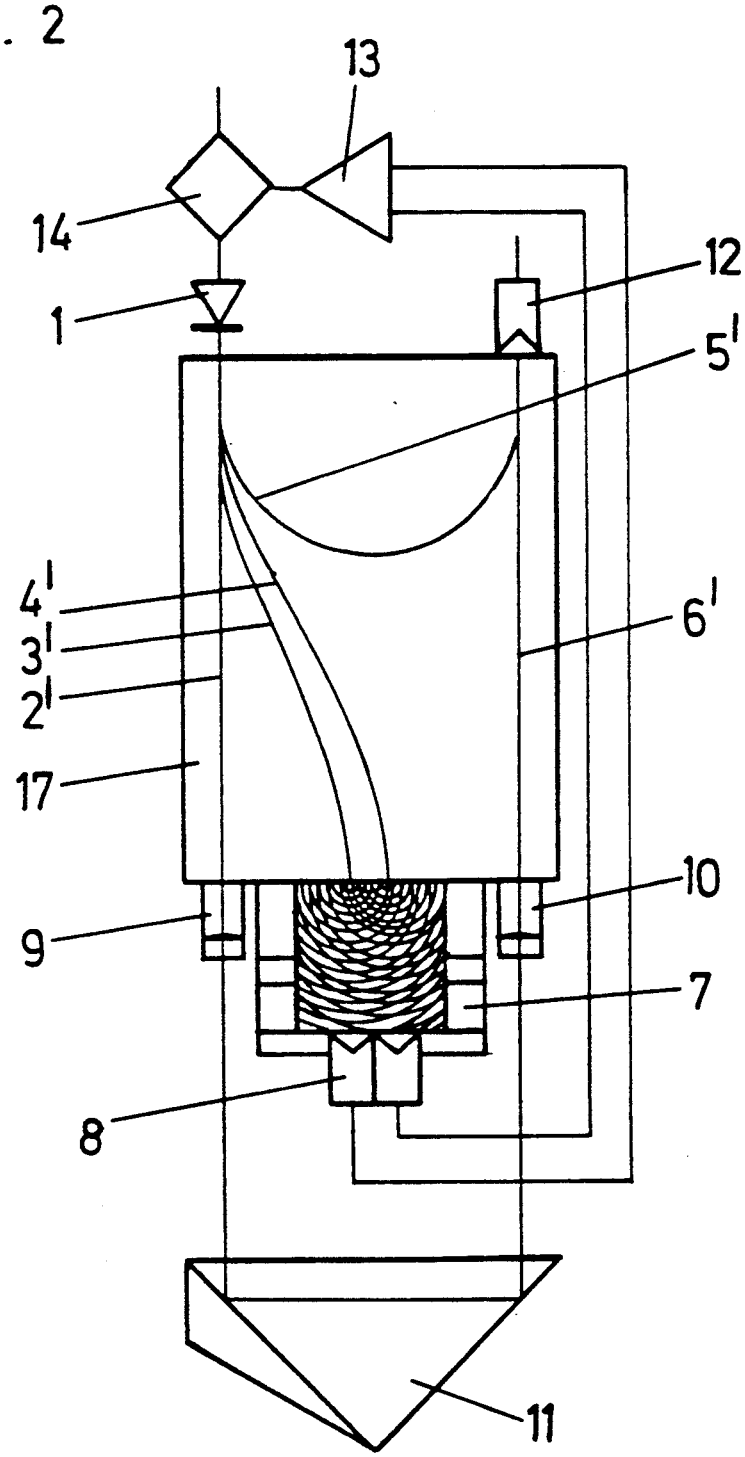
Figure 3:
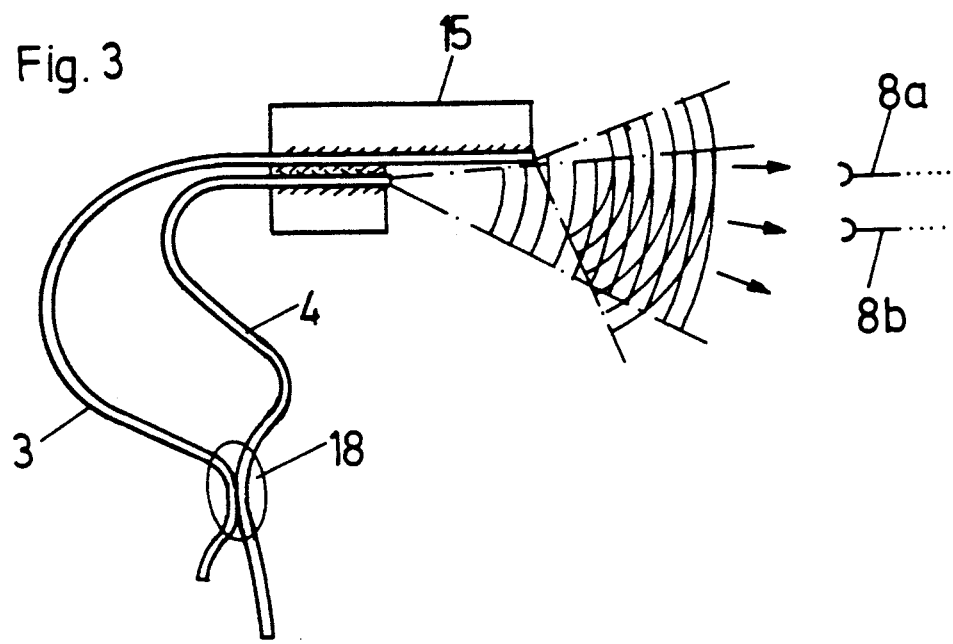
Figure 4:
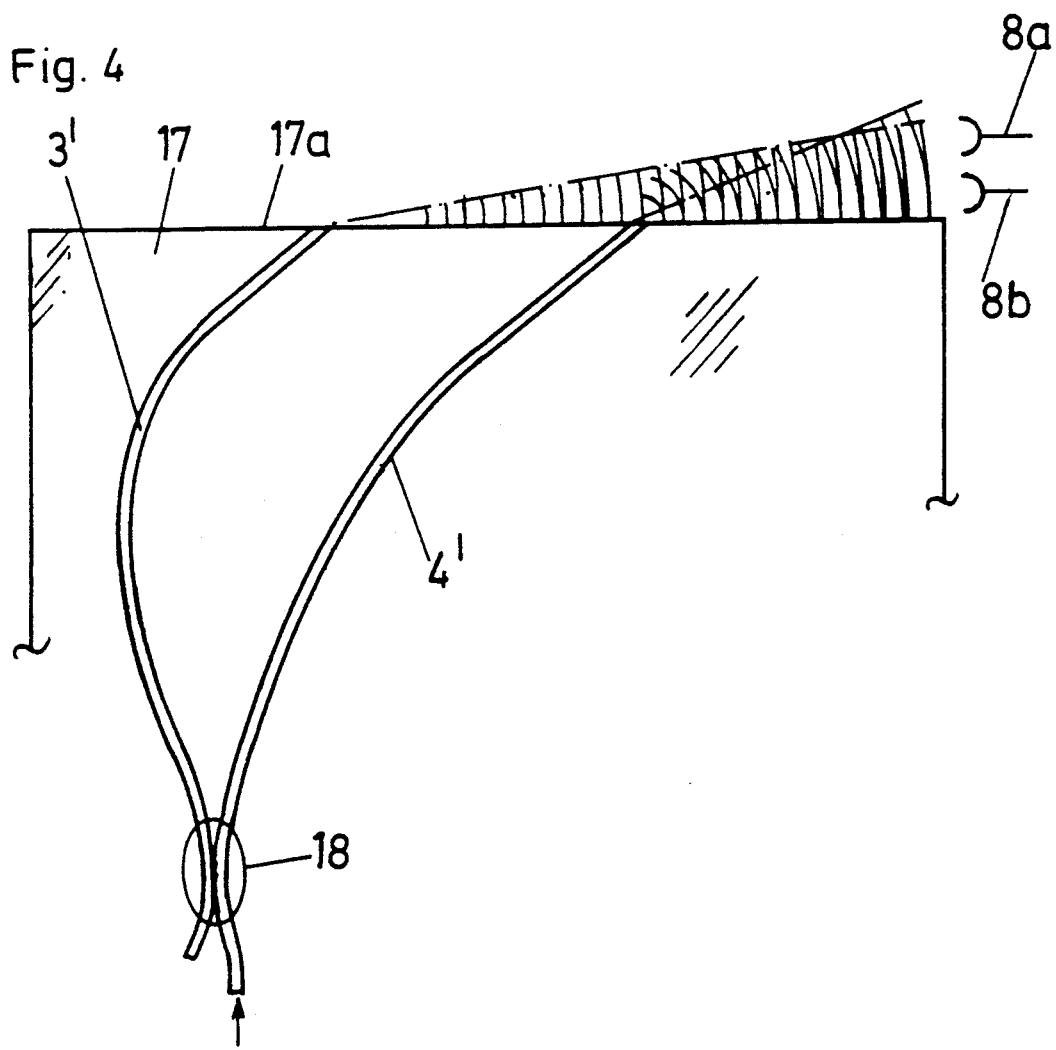
Figure 5:
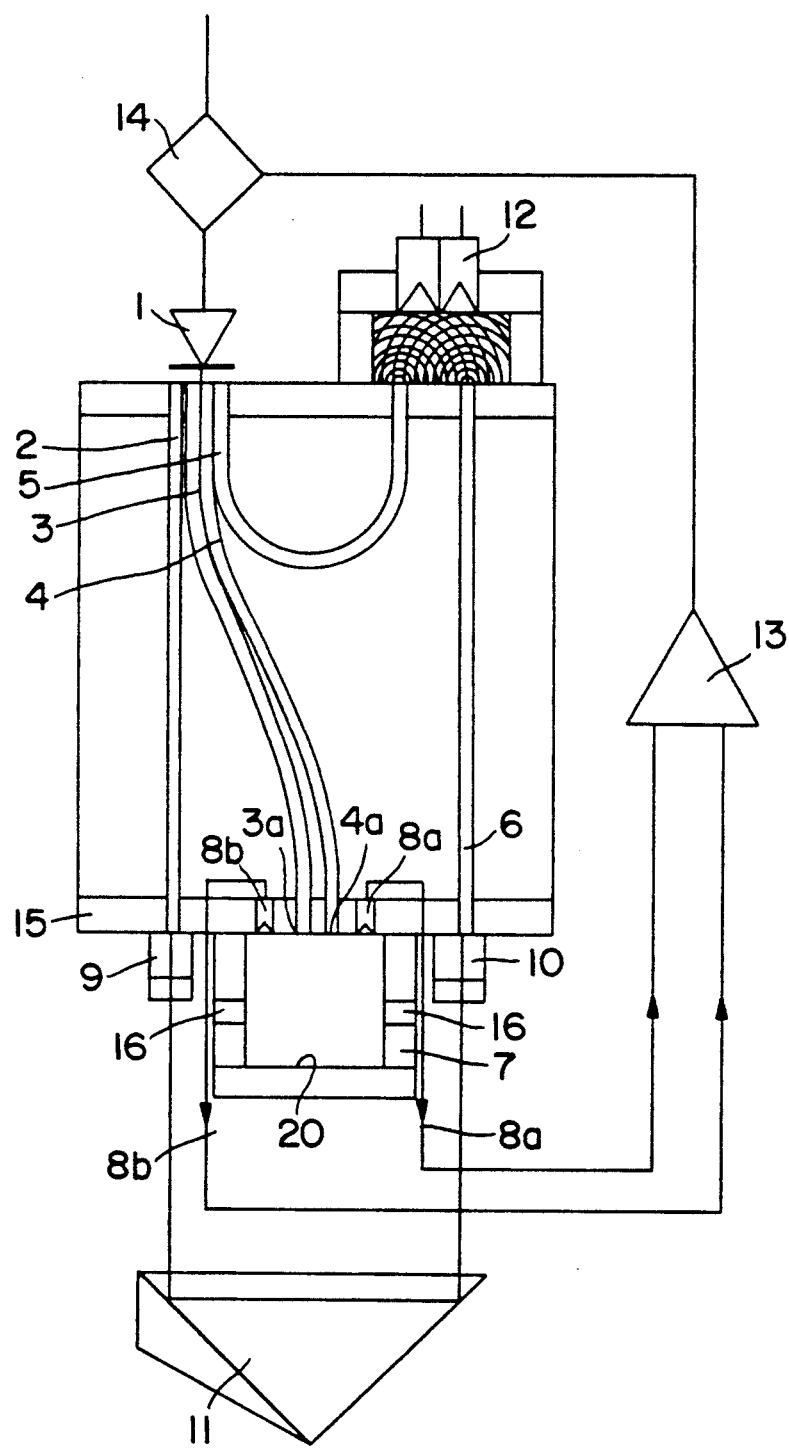

FIGS. 1, 2 and 5 show schematic drawings of interferometers with examples of embodiments of a device for wavelength stabilization according to the invention, and FIGS. 3 and 4 schematically show other versions of the device according to the invention.

FIG. 1 shows a schematic arrangement of a wavelength-stabilized length measurement interferometer, built with fiberglass technology. The laser diode radiates, e.g. via coupling lenses, which are not shown, into the single-mode fibers 2,3,4 and 5. The fiber 2 conducts the measurement beam via object 9 to the measuring section in the ambient medium (air). The triple mirror 11, as a moving measuring prism, deflects and the lens 10 couples the light beam into the fiber 6. The reference beam conducted in the reference fiber 5 and the measuring beam conducted in the fiber 6 generate spatial interference at the output of the fibers which is detected by the measuring photo detectors 12 to measure the length.

The device according to the invention for stabilizing the wavelength in the gaseous ambient medium (air) of the light emitted by the laser diode 1 has two optical fibers 3 and 4 (preferably single-mode glass fibers) that conduct the light from the laser diode 1 and whose ends 3a and 4a from spaced, basically point light sources.

From the end 3a and 4a of both optical fibers, which are held in a holder 15, two radiation cones emerge that overlap one another in the ambient medium and thus cause interference. The spacer ring 7 of glass ceramic or quartz glass holding both photo detector units 8a and 8b has permeation openings which permit air to penetrate into the ring enclosed by the spacer ring 7. The spacer ring 7 is firmly attached to the holder 15 and may be adhered, for example. Both adjacent photo-detector units 8a and 8b can be arranged at favorable locations at a given fixed distance from the locations of emergence 3a and 4a from the optical fibers 3 and 4. The signal coming from the photodetector units 8a and 8b is fed to a control device 13, which consists of a comparator in the simplest case. The output of the control unit 13 is connected to the current source 14 powered by the laser diode and controls the injection current of the laser diode and thus the emission frequency of the laser diode in such a way that when there are changes in the refraction index of the ambient medium, the detected interference and thus the light wavelength remain constant. Of course, other control parameters that influence the frequency of the laser diode 1, for example, its temperature, can be controlled by the control device 13. It is also possible to use other laser light sources that can be tuned with respect to the frequency.

FIG. 2 also shows an air wavelength-stabilized length-measurement interferometer, wherein equal or equivalent parts are identified with the same reference numbers as in FIG. 1. The basic difference compared to the version shown in FIG. 1 consists of the fact that in the version shown in FIG. 2 the waveguides are on waveguide paths 2' to 6' integrated in a carrier substrate (for example, glass or lithium niobate). Besides a compact structure, the advantage of such a system based on integrated optics technology consists of the fact that a separate holder for the emerging ends of the waveguides 3' and 4' is not necessary. The spacer ring 7 can be attached directly to the carrier substrate 17, for example by adhesion.

In the embodiment shown in FIG. 3, the light from the laser light source enters the optical fibers 3 and 4 via a beam splitter (fiber coupler) 18. The end areas of the optical fibers are placed parallel to one another, but they end at the staggered locations, seen in the longitudinal direction of the fibers, so that both photo detectors 8a and 8b, which are spatially fixed using a spacer that is not shown, receive higher orders of interference. In the embodiment shown in FIG. 4, there are again waveguide paths 3' and 4' integrated in a carrier substrate, which reach the edge 17a of the carrier substrate 17 unter an angle, so that the emission light cone is broken off from the vertical. Both photo detectors 8a and 8b detect the spatial interference.

In integrated optics technology it can be a constructive advantage if the interference is optically folded by a mirror applied to the spacer ring (not shown). The spacer ring is then half as short and the detectors or their waveguides are on the same (chip) side as the sources.

Basically, more than two point light sources can be used to generate a spatial interference pattern in air. By the process of stabilization of air wavelengths in the atmosphere, a process is created which is simpler in construction and application for interferometric length-measurement technology compared to known frequency stabilization with subsequent parametric measurement of the refractive index of the air and its subsequent correction.

The interference process of double (or multiple) sources requires no expensive couplings of glass fibers and no objects for coupling the radiation into or from the air space. It makes possible simple wavenlength reference in the form of a spacer, which has no high demands for form and measurement precision (in contrast to the known Fabry-Pérot Etalons, which must have a reflecting pair of parallel plates and a spacer ring with higher precision).

We claim:

1. A device for determining the wavelength of coherent light from a laser light source found in a preferably gaseous ambient medium, with at least one photo-detector unit to detect interference generated by light from the laser light source in the ambient medium, wherein light stemming from the laser light source is led to and emanates from two spaced locations, which basically constitute point laser light sources, into the ambient medium and that the light waves emitted by the basically point light sources interfere in the ambient medium forming spatial interference detected by one or more photo-detector units, wherein light coming from the laser light source is guided in at least two light waveguides, whose ends leading into the ambient medium are spaced apart and form basically point light sources, and wherein the light waveguides are waveguide paths integrated in a carrier substrate, which end at spaced points at the edge of the carrier adjacent to the ambient medium.

2. A device according to claim 1, wherein the waveguide reach the edge of the carrier at an angle different from 90°.

3. A device according to claim 1, wherein the ends of the waveguide paths lie in a plane with the surface of the edge of the carrier.

4. A device according to claim 1, wherein the laser light source is a laser diode.

5. A device according to claim 1, wherein the interference is reflected back to the point light sources by using a mirror, and the one or more photo-detector unit lie side by side with the point light source.

6. An interferometer for length measurement with a device for detecting the wavelength is a gaseous medium according to claim 1.

7. An interferometer according to claim 6, wherein laser light from the laser light source led over a constant reference distance and over a changing measuring distance and that light from the same laser light source is led in waveguides and emanates from these light waveguides at two spaced locations basically representing two point light sources generating a spatial interference pattern, which is detected by at least one measuring photo-detector.

8. A device for stabilizing the wavelength of coherent light from a laser light source found in a preferably gaseous ambient medium, with at least one photo-detector unit to detect interference generated by light form the laser light source in the ambient medium, wherein light stemming from the laser light source is led to and emanates from two spaced locations, which basically constitute point laser light sources, into the ambient medium and that the light waves emitted by the basically point light sources interfere in the ambient medium forming spatial interference detected by one or more photo-detector units wherein characterized by the fact that it includes an electronic control device which is connected to the one or more photo-detector unit and changes the frequency of the laser light source when there are variations in the refractive index of the ambient medium so that the spatial interference and thus the wavelength in the ambient medium remain constant.

9. A device according to claim 8, wherein light coming from the laser light source is guided in at least two light waveguides, whose ends leading into the ambient medium are spaced apart and form basically point light source.

10. A device according to claim 9, wherein the light waveguides are waveguide paths integrated in a carrier, which end at spaced points at the edge of the carrier adjacent to the ambient medium.

11. A device according to claim 10, wherein the waveguide paths reach the edge of the carrier at an angle different from 90°.

12. A device according to claim 10, wherein the ends of the waveguide paths lie in a plane with the surface of the edge of the carrier.

13. A device according to claim 12, wherein the spacer is connected to the carrier.

14. A device according to claim 9, wherein the light waveguides are flexible optical fibers which are spatially held by a holder or the like, at lesat at the ends facing the ambient medium.

15. A device according to claim 14, wherein the spacer is connected to the holder or is built in a one-piece unit with it.

16. A device according to claim 8, wherein one or more photo-detector units are attached to a spacer, which is used to keep a constant distance between the basically point light sources and the one or more photo-detector units.

17. A device according to claim 16, wherein the spacer, which is ring-shaped, encloses a space in which the interference and which communicates with the surrounding air through openings in the spacer.

18. A device according to claim 16, wherein the spacer is made of material with a thermal coefficient of expansion below $10^{-6}K^{-1}$.

19. A device according to claim 8, wherein the laser light source is a laser diode.

20. A device according to claim 8, wherein the interference is reflected back to the point light sources by using a mirror, and the one or more photo-detector units lie side by side with the point light source.

21. An interferometer for length measurement with a device for stabilizing the wavelengths in a gaseous medium according to claim 8.

22. An interferometer according to claim 21, wherein laser light from the laser light source led over a constant reference distance and over a changing measuring distance and that light from the same laser light source is led in waveguides and emanates from these light waveguides at two spaced locations basically representing two point light sources generating a spatial interference pattern, which is detected by at least one measuring photo-detector.

23. A device for determining the wavelength of coherent light from a laser light source found in a preferably gaseous ambient medium, with at lesat one photo-detector unit to detect interference generated by light from the laser light source in the ambient medium, wherein light stemming from the laser light source is led to and emanates from two spaced locations, which basically constitute point laser light sources, into the ambient medium and that the light waves emitted by the basically point light sources interfere in the ambient medium forming spatial interference detected by one or more photo-detector units, wherein one or more photo-detector units are attached to a spacer, which is used to keep a constant distance between the basically point light source and the one or more photo-detector units.

24. A device according to claim 23, wherein the light waveguides are flexible optical fibers, which are spatially held by a holder or the like, at lesat at the ends facing the ambient medium, and wherein the spacer is connected to the holder or is built in a one-piece unit with it.

25. A device according to claim 23, wherein the spacer is connected to the carrier.

26. A device according to claim 23, wherein the spacer, which is ring shaped, encloses a space in which the interference occurs and which communicates with the surrounding air through openings in the spacer.

27. A device according to claim 23, wherein the spacer is made of a material with a thermal coefficient of expansion below $10^{-6}K^{-1}$.

* * * * *